United States Patent [19]
Otto

[11] Patent Number: 4,860,941
[45] Date of Patent: Aug. 29, 1989

[54] BALL BONDING OF ALUMINUM BONDING WIRE

[75] Inventor: Alexander J. Otto, Kingston, Canada

[73] Assignee: Alcan International Limited, Montreal, Canada

[21] Appl. No.: 27,647

[22] Filed: Mar. 19, 1987

[30] Foreign Application Priority Data

Mar. 26, 1986 [CA] Canada ................................ 505168

[51] Int. Cl.$^4$ ............................................. B23K 31/00
[52] U.S. Cl. ..................................... 228/179; 228/209
[58] Field of Search ............... 228/179, 209, 208, 238; 219/56.1, 56.21

[56] References Cited

U.S. PATENT DOCUMENTS 4,580,713  4/1986  Sekibata et al. ..................... 228/110

Primary Examiner—Nicholas P. Godici
Assistant Examiner—Karen Skillman
Attorney, Agent, or Firm—Cooper & Dunham

[57] ABSTRACT

An improved method is described for ball bonding an aluminum wire to a contact pad of a microelectric device. In ball bonding, the wire is fed through and protrudes from a capillary hole in a bonding head, an electric arc melts the protruding wire into a ball, the solid ball thus formed is pressed and flattened onto the contact pad by the bonding head and the ball-contact surface interface is subjected to ultrasonic vibrations to form a bond between the flattened ball and the contact pad. Aluminum wire has presented a problem in forming asymmetric, porous, faceted balls that ball-bond very poorly. By using an aluminum wire coated with an electrically insulating layer that melts above the melting temperature of aluminum and has an electrical resistance sufficient to prevent the electric arc from shifting up the wire and away from the tip, the problem of poor quality balls is solved and a round, axisymmetric ball is formed which ball-bonds consistently well.

7 Claims, 3 Drawing Sheets

BALL BONDING OF ALUMINUM BONDING WIRE

BACKGROUND OF THE INVENTION

This invention relates to the ball bonding of aluminum bonding wire, particularly for use in the microelectronics field.

Very fine aluminum and gold based wires are commonly used to connect integrated circuits to lead frame packages. In a typical system,, the integrated circuit is placed in the package center and bonding wire segments connect pads on the integrated circuit perimeter to leads embedded in the package.

Bonding wire segments are typically joined to integrated circuits and lead frames by either the wedge-wedge bonding method or the ball-wedge method. In the ball-wedge method, the bonding wire is fed through a capillary hole in a bonding head until the tip of the wire protrudes a short distance. Then an electric arc melts the protruding wire tip into a ball. After arcing ceases, the molten ball quickly solidifies because heat is transferred into both the wire stem and the surrounding gas. The solid ball is pressed and flattened onto the contact pad by means of the bonding head and ultrasonic vibrations are applied to the ball-pad interface to form a bond (ball-bond) between the ball and the pad. The bonding head then threads the wire to the lead by a looping path and the wire under the bonding head is pressed onto the lead while ultrasonic vibrations form a bond (wedge-bond) between the wire and the lead. As the bonding head lifts away from the wedge-bond, the wire is pulled apart, leaving the wire tip protruding for the next ball-wedge bonding cycle.

Although aluminum wire has strength and cost advantages over gold wire, it is not used in ball-wedge bonding because it does not form a ball as well as gold wire. Specifically, the aluminum wire forms an asymmetric, porous, faceted ball that ball-bonds very poorly, while the gold wire forms a round, axisymmetric ball that ball-bonds consistently well.

Some researchers, such as Gehman, B. L., Ritala, K. E. and L. C. Erickson, "Aluminum Wire For Thermosonic Ball Bonding in Semiconductor Devices", Solid State Technology, October 1983, pp. 151–158, have blamed the poor ball-bonding behaviour of aluminum wire on the oxide film present on the wire. For instance, in air at ambient temperature an oxide film having a thickness of about 0.005 microns is formed. Gehman, et al have shown that the oxide film is strong enough to prevent surface tension from forming a ball for some time after melting of the aluminum wire tip. It has been suggested that further heating by the arc breaks up the oxide sheath by partially melting it or by boiling components of the cylindrical, molten wire. The molten wire then contracts to the most compact geometry possible with the oxide fragments left on the molten metal surface.

Other investigations have shown that the arc entry location into the wire shifts about to new locations of reduced resistance on the aluminum wire surface causing these local areas to melt and oxidize. Both oxidation and melting of aluminum at the arc entry area contribute to shifting arc entry location because both increase the electrical resistance of the initial entry area, forcing the arc up the wire to areas of lower resistance. Shifting of the arc also causes the partially molten wire tip to bend and twitch in response to the changing electromagnetic and surface forces.

Thus, it would appear that irregular balls on aluminum wire result from (1) shifting arc entry into the aluminum wire, (2) localized oxide melt and/or metal boiling required to break-up the oxide and (3) persistance of oxide fragments on the collapsed, molten wire tip during solidification.

It is the object of the present invention to provide a method for improving the ball-forming behaviour of aluminum bonding wire.

SUMMARY OF THE INVENTION

It has been found in accordance with this invention that when ball-bonding aluminum wire, the problem of asymmetric, porous, faceted balls that bond poorly can be overcome by utilizing an aluminum wire coated with an electrically insulating film that melts above the melting temperature of aluminum, with the film having a sufficient electrical resistance to prevent the electric arc from shifting up the wire and away from the tip. As a consequence, a round, axisymmetric ball is formed.

The insulating film is preferably mechanically strong and preferably has a melting point at or near the melting temperature of aluminum oxide. Generally, a minimum melting temperature of 700° C. is required and it may be as high as 2500° C.

The insulating film is typically a coating that is applied to the wire after the wire has been drawn and cleaned. A variety of methods can be used for making a suitable insulation coating on aluminum wire, such as glassy oxide coating, gaseous oxidation, chemical oxidation, sol-gel deposition, sputter coating, etc. It has, however, been found to be particularly convenient to form the coating by anodizing. During anodizing, the positively charged wire is pulled through a negative charged electrolyte. The electrolyte and electric potential oxidize aluminum at the aluminum metal-oxide interface, thereby greatly increasing the thickness of the oxide. The anodic oxide made by this method can be many orders of magnitude thicker than air-formed oxide and generally has a thickness of about 0.01 to 1.0 micron, preferably about 0.05 to 0.15 micron. Alumina insulating layers thicker than 1.0 micron will leave oxide debris on the surface o the ball. This debris interferes with bonding. An insulating layer with a breakdown voltage of less than 4 volts will break down during the arcing process. For an alumina insulating layer to have a breakdown voltage greater than 4 volts it must have a thickness of at least 0.01 micron.

With this insulating coating of substantial thickness, during arcing, the electric current of the arc is forced to enter through the wire end because the air-formed oxide at that location has a lower effective resistance and breakdown voltage than the insulation coating on the wire stem. Thus, the arc heats and melts the wire end until the lower rim of the coating also commences to melt. At this temperature, the oxide on the wire end also melts and the molten aluminum surface of the wire tip is rounded by its surface tension. The surface tension of the molten insulation coating rim pulls the rim into the form of a ring that receeds up the wire during continued heating by the arc. This arc moves up on the newly exposed molten aluminum as the coating rim receeds. The surface tension of the molten aluminum forms a uniform, axisymmetric ball because the remaining oxide on the exposed aluminum surface is molten and/or negligible in quantity, and because the insulation coating does not allow the arc to move up locally onto the wire stem.

Both porous and barrier layer anodic oxide types improve the ball forming behaviour of aluminum wire because both types are electrically resistive and both have the required high melting temperature. The barrier layer anodic oxide type is usually preferred because it is a fairly pure, continuous and fully dense phase of partially hydrated alumina and because it can be formed to close thickness tolerances in the thickness range of 0.01 to 1.0 micron.

Common electrolytes that form a barrier layer usually contain weak acids, such as tartaric acid or ammonium borate. Barrier layers form if the electrolyte combined with the electric field oxidize the aluminum without dissolving enough of the anodic oxide to allow the continuous growth of a porous layer. During porous layer type of anodizing, partial local dissolution of the anodic oxide forms pores. Continued dissolution of the oxide at the pore bottoms keeps the distance from the pore bottoms to the oxide-aluminum interface in the thickness range where the electric field can induce ion migration from the pore bottoms to the oxide-aluminum interface. Thus the porous oxide layer thickness is determined chiefly by the anodizing time. However, the growth rate of the barrier layer anodic oxide continually decreases as the barrier layer thickens until growth stops when the electric field can no longer force ions across the attained thickness of oxide. Thus, the barrier anodic oxide layer thickness is determined chiefly by the anodizing voltage.

The aluminum wires used in this invention typically have diameters in the range of from about 10 to about 500 microns. However, for most commercial uses the wires preferably have diameters in the range of from 17 to 60 microns.

The wire may be of pure aluminum or of an aluminum alloy. Typical alloys that may be used include Al/Si alloy and Al/Mg alloy.

DESCRIPTION OF THE PREFERRED EMBODIMENTS

In the drawings which illustrate the invention:

Figure 1A:
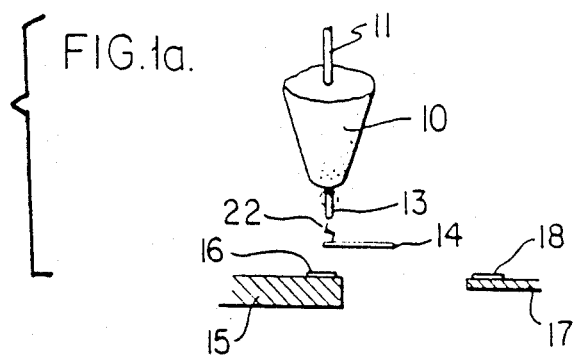
FIG. 1 is a schematic representation of the ball-wedge bonding technique.

A typical ball-wedge bonding system is shown in FIG. 1 with a bonding head 10 having a capillary 12 therein through which passes a wire 11. The wire tip 13 protrudes from the bottom of the capillary hole 12.

Figure 1B:
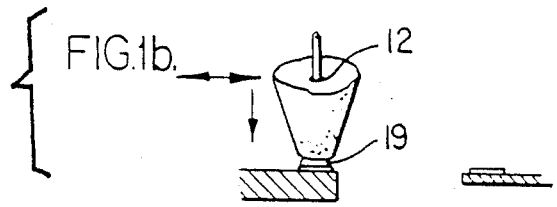

An electrode 14 is positioned a short distance below the wire tip 13 and an electric arc 22 is formed between the electrode and the wire tip 13. This arc melts the wire tip and forms a ball which, as shown in FIG. 1(b), is pressed and flattened onto contact pad 16 of integrated circuit component 15, resulting in the flattened ball 19. While this pressing and flattening is taking place, ultrasonic vibrations are applied to the bonding head 10 by means of a transducer, typically at a frequency of about 60 kHz. This results in the bonding of the flattened ball 19 to the pad 16.

Figure 1C:
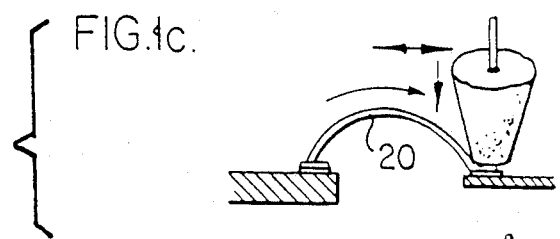

The bonding head 10 then moves as shown in FIG. 1(c) forming a looping path 20 with the wire and reaching a location over contact pad 18 of lead 17. In this location, with the bonding head 10 pressing the wire onto the contact pad 18, the ultrasonic vibrations are again applied to form a wedge-bond between the wire and contact pad 18.

Figure 1D:
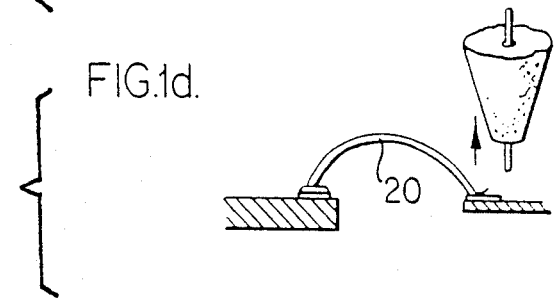

As the bonding head 10 is moved away from lead 17 as shown in FIG. 1(d), the wire is pulled apart leaving the wire tip protruding for the next ball-wedge bonding cycle.

When using the aluminum wire of this invention in the above method, the aluminum wire is preferably first cleaned by electrochemical milling or electropolishing. During electrochemical milling, the positively charged aluminum wire is pulled through a negatively charged electrolyte. The electrolyte preferentially oxidizes aluminum from asperities and it dissolves the reaction product so that the aluminum surface contains only about 0.005 microns of oxide that forms in air after the wire is removed from the electrolyte. Score lines and surface contaminants can be removed from the aluminum wire in the above manner, along with some of the aluminum to thin and/or clean the wire.

The aluminum wire cleaned and prepared in the above manner is then anodized by pulling the positively charged wire through a negatively charged electrolyte. The electrolyte and electric potential oxidize the aluminum at the aluminum metal-oxide interface thereby creating the desired thick oxide coating.

The ball formation with the method of the present invention can best be seen from FIG. 2. It will be seen in FIG. 2(a) that the anodized wire 21 protrudes from the bonding head 10. An electrode 14 is positioned to create an electric arc 22 between the electrode and the bottom tip of insulated aluminum wire 21. In FIG. 2(a), the lower end of the wire has commenced to melt, forming a small melting front. In FIG. 2(b), the insulation coating has also started to melt and the molten aluminum surface is rounded by its surface tension. A skirt 23 has also started to form between the ball and the wire 21.

Figure 2A:
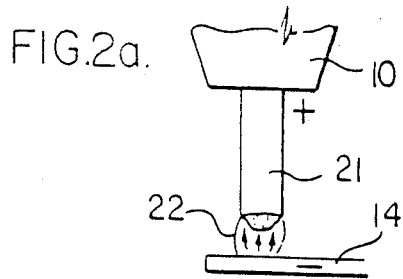
FIG. 2 is a schematic representation of the ball-forming technique of the present invention.
Figure 2B:
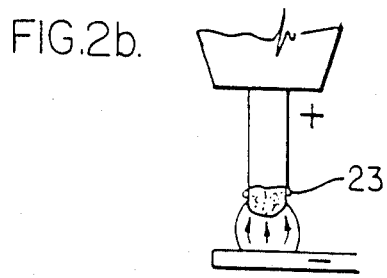
Figure 2C:
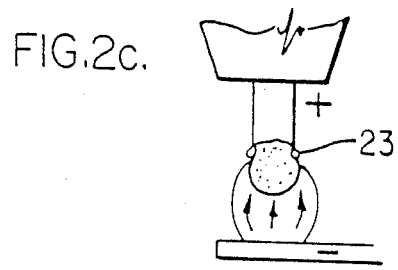

In FIG. 2(c) the ball continues to grow as the aluminum wire and insulated coating melt and receed.

Figure 2D:
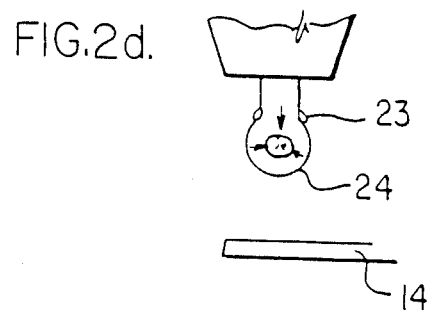

In FIG. 2(d), the arc is extinguished leaving a uniform, axisymmetric ball 24 which solidifies with a solid skirt 23 at the ball-wire junction.

The present invention is further illustrated by the following non-limiting example.

EXAMPLE 1

A substantial length of Al-1% Mg bonding wire having a diameter of about 30 microns was electrochemically thinned by about 1 micron to clean the surface. The equipment used for electrochemical milling consisted of a wire unspooler, tension controls, wire charging electrodes, a solution tank, wire washers and a wire spooler.

(a) One sample of the wire was then anodized in a porous oxide layer type of electrolyte consisting of 18% $H_2SO_4$ in water at about 11 V for about 30 seconds to form porous anodic oxide coatings of about 0.6 microns thick.

(b) A second sample of the wire was anodized in a barrier oxide layer type of electrolyte consisting of a 3% tartaric acid-ammonium hydroxide aqueous solution having a pH of 6 at about 95 V for about 35 seconds. A barrier layer anodic oxide was obtained having a thickness of about 0.1 micron.

Balls were formed on the anodized wires by the technique shown in FIG. 2. The photos of FIG. 3 illustrate the ball and skirt formed on Al-1% Mg wire anodized at 95 V in the tartaric acid electrolyte as described in (b)

Figure 3A:
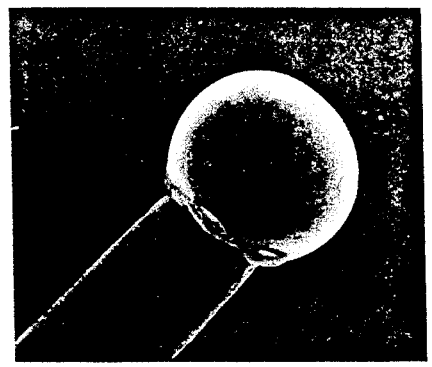
FIG. 3 is three photographs of a ball formed in accordance with the present invention.
Figure 3B:
Figure 3C:

FIG. 3(a) shows a ball formed on a 30 micron above diameter Al-1% Mg wire coated by a 0.1 micron thick, barrier layer anodic oxide, while FIG. 3(b) shows the oxide skirt formed at the ball-wire junction and FIG. 3(c) is a 5,000 magnification of the ball surface. Auger analyses of the ball surface showed that it contained only about 0.003 microns of aluminum and magnesium oxide, while metallographic sections showed that the skirt was about 1 micron thick oxide.

The wire anodized in the $H_2SO_4$ electrolyte as described in (a) above also formed round axisymmetric balls. However, the oxide skirt was much larger and irregular on these balls because the porous layer anodic oxide was fairly thick and uneven.

I claim:

1. In a method for ball bonding an aluminum wire to a contact pad wherein the aluminum wire is fed through and protrudes from a capillary hole in a bonding head, an electric arc melts the protruding wire into a ball, the solid ball thus formed is pressed and flattened onto the contact pad by the bonding head and the ball contact surface interface is subjected to ultrasonic vibrations to form a bond between the flattened ball and the contact pad, the improvement which comprises utilizing an aluminum wire coated with an electrically insulating film that melts above the melting temperature of aluminum, said film being an oxide coating having a thickness of about 0.01 to about 1.0 micron and a melting temperature of at least about 7007° C., said film having an electrical resistance sufficient to prevent the electric arc from shifting up the wire and away from the tip, whereby a round, axisymmetric ball is formed.

2. A method according to claim 1 wherein the aluminum wire is coated by anodizing to form said oxide coating.

3. A method according to claim 2 wherein the oxide coating has a thickness of about 0.05 to 0.15 micron.

4. A method according to claim 2 wherein the insulating film has a melting temperature in a the range of about 700° C. to about 2500° C.

5. A method according to claim 2 wherein the insulating film has a melting temperature at or near the melting temperature of aluminum oxide.

6. A method according to claim 4 wherein the aluminum wire has a diameter in the range of about 10 to about 500 microns.

7. A method according to claim 6 wherein the aluminum wire has a diameter in the range of from 17 to 60 microns.

* * * * *